(12) United States Patent
Talieh

(10) Patent No.: US 6,296,743 B1
(45) Date of Patent: Oct. 2, 2001

(54) APPARATUS FOR DC REACTIVE PLASMA VAPOR DEPOSITION OF AN ELECTRICALLY INSULATING MATERIAL USING A SHIELDED SECONDARY ANODE

(75) Inventor: Homoyoun Talieh, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 08/042,035

(22) Filed: Apr. 2, 1993

(51) Int. Cl.⁷ .................................................. C23C 14/38
(52) U.S. Cl. ................. 204/192.22; 204/192.12; 204/298.06; 204/298.08; 204/298.09; 204/298.11; 204/298.14
(58) Field of Search ............ 204/192.12, 298.06, 204/298.07, 298.08, 298.09, 298.11, 298.14, 298.19, 192.22

(56) References Cited

U.S. PATENT DOCUMENTS

| | | | |
|---|---|---|---|
| 4,038,171 | * 7/1977 | Moss et al. | 204/298.06 |
| 4,619,755 | * 10/1986 | Hessberger et al. | 204/298.14 |
| 4,871,434 | * 10/1989 | Munz et al. | 204/198.07 |
| 5,126,032 | * 6/1992 | Szczyrbonski et al. | 204/298.14 |

FOREIGN PATENT DOCUMENTS

| | | | |
|---|---|---|---|
| 3612721 | 10/1987 | (DE) | C23C/14/34 |
| 4042289 | 7/1992 | (DE) | C23C/14/35 |
| 0534066 | 3/1993 | (EP) | C23C/14/32 |
| 2568269 | 1/1986 | (FR) | C23C/14/34 |

OTHER PUBLICATIONS

M. Pinarbasi, "Hydrogenated Amorphous Silicon Films Deposited by Reactive Sputtering", *Thin Solid Films* (1989), pp. 217–233 at 220.

M. Pinarbasi, "Growth, Properties, and Electrical Stability of DC Magnetron Sputtered Hydrogenated Amorphous Silicon Thin Films" University of Illinois at Urban–Champaign Doctoral thesis, 1989, pp. 25–27 and Figure 7.

* cited by examiner

*Primary Examiner*—Rodney G. McDonald
(74) *Attorney, Agent, or Firm*—McCarter & English

(57) ABSTRACT

In a plasma vapor deposition reactor for depositing an electrically insulating material using a DC sputtering process the plasma is stabilized, maintaining its sputtering efficiency, by provision of a secondary anode, preferably held at a positive bias with respect to the primary anode. The secondary anode is shielded from exposure to the stream of sputtered material, yet situated close enough to the plasma discharge to attract electrons from the plasma to maintain its charge balance. In reactive sputtering, the sputtering chamber contains both a sputtering gas, for example argon, and a reactive gas, for example oxygen. Positive ions of the sputtering gas bombard a target of the material to be sputtered. Atoms of the target material, the sputtered atoms, are emitted from the target in all directions into the chamber, some of them falling on the substrate surface to be sputter coated. At the surface or in the chamber they chemically combine with the reactive gas. In the instance to which this invention applies, the chemical combination forms an electrically insulating coating on the substrate. The same electrically insulating material coats all other surfaces expose to the flux of sputtered atoms. In an embodiment of the invention the positively biased secondary anode, being shielded from the sputtered atoms is not coated by the electrically insulating material, thus maintaining its ability to draw electrons from the plasma.

12 Claims, 1 Drawing Sheet

APPARATUS FOR DC REACTIVE PLASMA VAPOR DEPOSITION OF AN ELECTRICALLY INSULATING MATERIAL USING A SHIELDED SECONDARY ANODE

BACKGROUND OF THE INVENTION

1. Field of the Invention

This invention relates to the plasma vapor deposition of a layer of an electrically insulating material on a substrate by reactive sputtering. More particularly the inventive method and apparatus permits the sputter coating to be done using a DC plasma discharge.

2. Description of the Background Art

Sputter coating is a widely used technique for depositing a thin film of material on a substrate. In one form of this technique, known as DC sputtering, positive ions from a plasma discharge formed between an anode and a target cathode are attracted to and strike the target, dislodging the sputtering atoms from the target surface. Some of the dislodged atoms fall on the surface of the substrate and form a coating. In reactive sputtering a gaseous species is also present at the substrate surface and reacts with, and in some embodiments combines with, the atoms from the target surface to form the desired coating material. This material is also deposited on any other surface exposed to the sputtered atoms. It is recognized in the prior art that if the coating is an electrically insulating material, such as a metal oxide, the build up of the material on other parts of the sputtering apparatus can cause problems. In particular, the build up of an insulating coating on the anode interferes with the ability of the anode to remove electrons from the plasma, as required to maintain the plasma's charge balance. This destablizes the plasma and interferes with controlled deposition. As a result, it is common to use a different sputtering technique, RF sputtering, to deposit layers of insulating materials. However, RF sputtering is a less efficient, less controllable and more expensive process than DC sputtering.

Pinarbasi met this problem when trying to deposit layers of hydrogen-containing amorphous silicon. His work was published as a 1989 doctoral thesis for the University of Illinois at Urbana-Champaign entitled "Growth, Properties and Electrical Stability of DC Magnetron Reactive Sputtered Hydrogenated Amorphous Silicon Thin Films" and in *Thin Films*, 171 (1989) Pp. 217–233. To reduce this effect, Pinarbasi shielded the anode with a positively biased anode shield to carry the electron current from the plasma. This reduced the problem enough to permit deposition of the experimental films. (See especially Page 26 and FIG. 7) But a poorly understood transient effect, reported by Pinarbasi, indicates that the problem was not completely under control. This problem could seriously impact long term use of this process, such as in a production setting.

SUMMARY OF THE INVENTION

In the present invention a secondary anode electrode is included in the sputtering chamber and placed so as to be shielded from the stream of sputtered atoms. This secondary anode does not acquire a significant coating of electrically insulating material and retains its ability to attract enough electrons from the plasma to maintain the plasma's charge balance. This permits efficient use of DC sputtering for deposition of insulating materials and avoids the commonly considered need to use the less efficient and less controllable RF Sputtering technique.

In a DC Sputtering apparatus, an electric field is produced between a primary anode and a target holder, holding a target of the material to be sputtered. The target and target holder form the cathode. The field ionizes the sputtering gas, held at well below atmospheric pressure in the sputtering chamber and forms a plasma discharge. Positive ions from the plasma are attracted to the target, strike the target and dislodge atoms from the target surface. The atoms are emitted in all directions from the target surface. Since these atoms are almost entirely charge neutral, their paths are straight and not affected by electric or magnetic fields. They deposit on and coat any surface on which they fall. They fall on the substrate to be coated, on the walls of the sputtering chamber and on the primary anode. If the deposited material is electrically insulating, for example, if the sputtered atoms chemically combine with reactive gas species also present in the chamber and at the primary anode, an insulating coating on the primary anode interferes with its ability to absorb electrons from the plasma. The inventive placement of a secondary anode, shielded from the stream of sputtered atoms, prevents deposition of this coating or reduces deposition below the amount that represents a significant problem. The secondary anode can, for example, be placed behind a shield member, in a recess, or behind a shoulder, so long as it is out of geometric line of sight of the target surface. The effectiveness of this secondary anode in attracting electrons from the plasma can be enhanced by electrically isolating it from the primary anode and biasing it positively with respect to the primary anode.

DETAILED DESCRIPTION OF THE INVENTION

Figure 1:
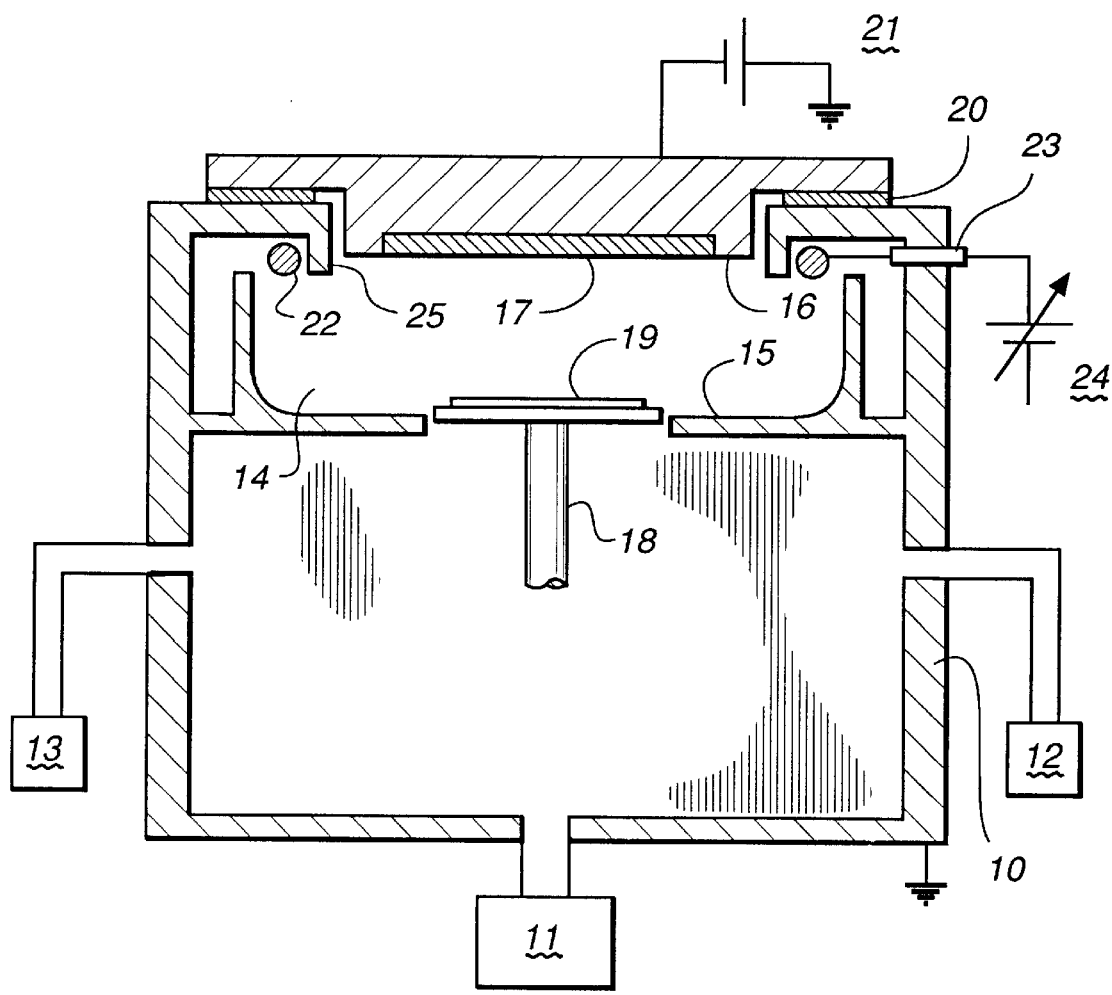
FIG. 1 is a side view in cross section of a sputtering apparatus of the invention showing a secondary anode shielded from the target surface by a shield member.

The inventive apparatus for plasma vapor deposition of films of an insulating material on a substrate uses the DC sputtering technique. This technique permits the use of a simple chamber and less expensive power supply than the commonly used RF sputtering technique. In addition, DC sputtering permits more rapid and controllable deposition. In this technique an electric field is produced between a positively biased anode electrode and a relatively negatively biased cathode electrode. The electrodes are situated in an evacuable chamber within which there is a gas (usually a noble gas, such as argon) held at a pressure well below atmospheric pressure. The electric field is strong enough to produce ionization of some of the gas atoms, acceleration of the ions in the field, collision with other atoms, and ultimately a sustained plasma discharge. The discharge region, containing both electrons and positive ions, is approximately charge neutral and maintains that neutrality as positive ions strike and are neutralized at the negatively biased cathode and electrons are absorbed by the positive anode. The addition of a magnetic field of suitable geometry and strength in the plasma region helps to confine the plasma to the desired region. This is known in the art as the magnetron technique.

Sputtering, that is to say emission of atoms from a target, takes place when the target is placed in the path of the positive plasma ions as they are accelerated toward the cathode electrode. If the target is metallic, it may itself constitute all or part of the cathode. The energetic positive ions of the sputtering gas collide with the target surface and knock atoms out of the surface like struck billiard balls. They are emitted from the target surface in all directions. The sputtered atoms of target material will adhere to whatever they strike, such as a substrate to be coated. They will also adhere to the anode electrode, other structures in the chamber and the chamber walls.

A deposited film of a combination of the target material and another chemical species can be formed by introducing the other species in gaseous form into the sputtering chamber. This is known as reactive sputtering. Chemical combination of the target species and the reactive gaseous species can take place in the chamber or at the substrate surface. For example, the ferroelectric material known as PZT (lead zirconate titanate) can be deposited using a target containing lead, zirconium and titanium with oxygen in the sputtering chamber to form the oxide of the desired composition. Such oxide films have been commercially produced in the past by the less desirable RF sputtering technique, because the insulating oxide coating also forms on the anode electrode resulting in plasma instability. The RF technique requires a high power (e.g. hundreds of watts) source of high frequency (e.g. 15 MHz) power and a chamber carefully designed to be electrically matched to the power source. In addition, the RF technique frequently utilizes toxic gaseous metal compounds as source of the film's metallic components.

In the apparatus disclosed herein, a secondary anode is shielded from the sputtered atoms suppressing formation of an insulating coating.

The secondary anode then maintains its ability to absorb electrons from the plasma and maintain the plasma's charge balance. This secondary anode can be electrically isolated from the primary anode and positively biased with respect to the primary anode to enhance its ability to attract electrons.

An exemplary apparatus of the invention is shown schematically in FIG. 1. It is depicted as being cylindrically symmetric about a vertical axis. The DC Sputtering chamber 10 is hermetically sealed so it can be evacuated by means of a pump 11. A sputtering gas can then be introduced into the chamber 10 from a sputtering gas source 12. The sputtering gas is usually a noble gas such as argon. If desired, a reactive gas can also be introduced into the chamber 10 from a reactive gas source 13. The chamber 10 is usually considered to be the electrical ground reference of the apparatus.

The region 14, within which the plasma discharge takes place, is bounded by the primary anode 15, typically maintained at the electrical potential of the chamber 10, the cathode 16 supporting a target 17 of the material to be sputtered, and the substrate support 18 holding a substrate 19. An electrically insulating seal 20 maintains the hermeticity of the apparatus and a DC power supply 21 maintains the cathode 16 at a negative potential with respect to the primary anode 15. The magnitude of the negative potential needed to support a plasma discharge in a gas of a particular species at a particular pressure in a plasma region of particular dimensions, and how these qualities are related are well known in the art. Potentials in the range of 300 volts to 400 volts in, for example, argon at pressures in the range of 2 mtorr to 20 mtorr with anode-cathode spacings in the range of one to ten centimeters are exemplary of such quantities.

The apparatus also has a secondary anode 22. Electrical connection to the secondary anode 22 is made through a hermetically sealed biasing means 23. A bias supply 24 is shown as being variable to signify that the secondary anode 22 can be held at the potential of the primary anode 15 or at a positive potential with respect to the primary anode 15 in order to enhance its ability to extract electrons from the plasma discharge. Positive voltage bias in the range from 10 volts to 200 volts can be effective, depending on other system from 25 volts to 100 volts.

Figure 2:
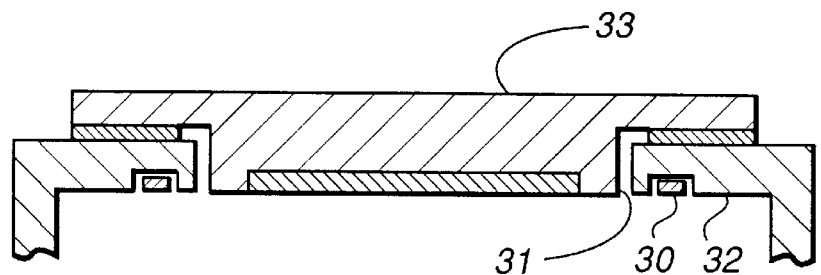
FIG. 2 is a side view in cross section of a portion of a sputtering apparatus of the invention showing the secondary anode situated in a recess.

The secondary anode 22 is shielded from the stream of sputtered atoms coming from the target 17 by a shield member 25. The shield member 25 must extend at least far enough that all parts of the secondary anode 22 are out of straight line exposure to all parts of the target 17. Because of some scattering of sputtered atoms through collisions with atoms of the sputtering gas, it may be necessary for the shield member to depend somewhat farther than this minimum distance. However, if it extends too far, the shield member 25 will interfere with the flow of electrons from the plasma discharge to the secondary anode 22. Heating of the secondary anode due to electron bombardment will also help reduce deposition of the sputtered material by causing the material to evaporate as it is deposited. The secondary anode may also incorporate a resistive element for heating. Many different structural arrangements for shielding the secondary anode 22 from the stream of sputtered atoms would be apparent to an apparatus designer. For example, FIG. 2 shows the secondary anode 30 situated within a grove 31 in the member 32 supporting the target holder 33.

What is claimed is:

1. An Apparatus for sputter coating a substrate with electrically insulating material by producing a stream of sputtered atoms incident on the substrate comprising a primary anode and an electrically isolated secondary anode so situated as to be shielded from the stream of sputtered atoms and a first biasing means for maintaining the secondary anode at a positive voltage bias with respect to the primary anode.

2. Apparatus of claim 1 in which the positive voltage bias is from 10 volts to 200 volts.

3. Apparatus of claim 1 including a shielding member so situated as to shield the secondary anode from the stream of sputtered atoms.

4. Apparatus of claim 3 in which the shielding member is metallic and is electrically connected to the primary anode.

5. Apparatus of claim 1 including a target holder and a second biasing means for maintaining the target holder at a negative bias with respect to the primary anode in order to produce a DC plasma discharge between the target holder and the primary anode.

6. Apparatus of claim 5 including means for introducing a sputtering gas and a reactive gas into a space, the boundary of which includes the target holder, the primary anode, and the substrate.

7. A sputtering apparatus, comprising:
   a sputtering chamber into which a sputtering gas can be filled;
   a substrate holder located in said chamber for holding a substrate;
   a sputtering target located in said chamber and biased at a first potential;
   a primary anode located in said chamber and biased at a second potential more positive than said first potential, whereby a plasma discharges between said sputtering target and said primary anode and particles sputtered from said sputtering target deposit on said substrate; and
   a secondary anode positioned within said chamber at a location not having a line of sight to said target and biased at a potential more positive than said second potential.

8. A sputtering apparatus as recited in claim 7, further comprising a shielding member disposed between said secondary anode and said target.

9. A sputtering apparatus as recited in claim 8, wherein said shielding member is biased at said second potential.

10. A sputtering apparatus as recited in claim 9, further comprising a source of a reaction gas into said chamber, said reaction gas reacting with said particles to deposit an electrically insulating material on said substrate.

11. A sputtering process, comprising the steps of:

DC sputtering a target comprising a target material by biasing said target negatively with respect to an anode, whereby portions of said target material are sputtered onto a substrate;

positively biasing a secondary anode with respect to said primary anode, wherein said secondary anode does not have a line of sight to said target.

12. A sputtering process as recited in claim 11, further including the step of reacting a reaction material with said target material sputtered from said target, whereby said substrate is deposited with an insulating film.

* * * * *